(12) United States Patent
Kuo et al.

(10) Patent No.: US 8,470,621 B2
(45) Date of Patent: Jun. 25, 2013

(54) METHOD FOR FABRICATING A FLIP-CHIP SEMICONDUCTOR OPTOELECTRONIC DEVICE

(75) Inventors: Chester Kuo, Taipei (TW); Lung Hsin Chen, Hsinchu County (TW); Wen Liang Tseng, Hsinchu (TW); Shih Cheng Huang, Hsinchu (TW); Po Min Tu, Chiayi County (TW); Ying Chao Yeh, Taipei County (TW); Wen Yu Lin, Taichung County (TW); Peng Yi Wu, Taichung (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 577 days.

(21) Appl. No.: 12/722,231

(22) Filed: Mar. 11, 2010

(65) Prior Publication Data

US 2010/0230711 A1   Sep. 16, 2010

(30) Foreign Application Priority Data

Mar. 13, 2009  (TW) .................. 98108127 A

(51) Int. Cl.
*H01L 33/48* (2010.01)
*H01L 27/15* (2006.01)
*H01L 33/00* (2010.01)

(52) U.S. Cl.
CPC .................. *H01L 27/156* (2013.01)
USPC .............. 438/28; 438/34; 438/108; 438/458; 257/E21.6; 257/E21.499; 257/E21.503; 257/E33.056

(58) Field of Classification Search
CPC .................................................. H01L 27/156
USPC .............. 438/26, 28, 34, 57, 64, 66–68, 73, 438/108, 118, 455, 458; 257/98–100, 676–678, 257/684, 723–724, 778, E33.056–E33.059, 257/E23.003, E23.116, E21.499, E21.503, 257/E21.599, E21.6, E21.511, E23.023, E23.031, 257/E23.06, E23.069, E21.532, E21.056–E21.058

See application file for complete search history.

(56) References Cited

U.S. PATENT DOCUMENTS

| 6,573,537 | B1 | 6/2003 | Steigerwald et al. |
| 2005/0194605 | A1* | 9/2005 | Shelton et al. ................ 257/99 |
| 2006/0071226 | A1* | 4/2006 | Kojima et al. ................ 257/98 |
| 2006/0278884 | A1* | 12/2006 | Chen ............................. 257/99 |
| 2007/0166851 | A1* | 7/2007 | Tran et al. .................... 438/22 |
| 2008/0242063 | A1* | 10/2008 | Pang et al. ................... 438/499 |
| 2010/0006883 | A1* | 1/2010 | Slater et al. .................. 257/98 |
| 2010/0078657 | A1* | 4/2010 | Nagai ........................... 257/88 |
| 2010/0213491 | A1* | 8/2010 | Lu et al. ....................... 257/98 |
| 2012/0126259 | A1* | 5/2012 | Mizutani et al. ............. 257/88 |

FOREIGN PATENT DOCUMENTS

| CN | 1619842 A | 5/2005 |
| JP | 2004-221186 A | 8/2004 |
| TW | I292962 | 1/2008 |
| TW | 097107609 | 9/2009 |
| TW | 097115512 | 11/2009 |
| TW | 097117099 | 11/2009 |

\* cited by examiner

*Primary Examiner* — Matthew Landau
*Assistant Examiner* — Maliheh Malek
(74) *Attorney, Agent, or Firm* — Altis Law Group, Inc.

(57) ABSTRACT

A method for fabricating flip-chip semiconductor optoelectronic devices initially flip-chip bonds a semiconductor optoelectronic chip attached to an epitaxial substrate to a packaging substrate. The epitaxial substrate is then separated using lift-off technology.

14 Claims, 10 Drawing Sheets

METHOD FOR FABRICATING A FLIP-CHIP SEMICONDUCTOR OPTOELECTRONIC DEVICE

BACKGROUND OF THE INVENTION

1. Field of the Invention

The present invention relates to an optoelectronic device, and relates more particularly to a flip-chip semiconductor optoelectronic device and a method for fabricating the same.

2. Description of the Related Art

Light emitting diodes are electronic devices that can convert electricity into light and have diode characteristics. Particularly, light emitting diodes only emit light when voltage is applied to their electrodes, and can emit stable light when direct current is supplied. However, light emitting diodes blink when alternating current is supplied, and the blinking frequency is determined by the frequency of the alternating current. The lighting theory of light emitting diodes is that electrons and holes in semiconductor material combine to produce light under an externally applied voltage.

Light emitting diodes have significant advantages of long lifespan, low heat generation, low electricity consumption, energy conservation, and pollution reduction. Light emitting diodes are widely adopted; however, their low light emitting efficiency is one problem that still needs to be resolved.

Packaged light-emitting diode devices can be categorized into horizontal type light-emitting diode devices and vertical type light-emitting diode devices. FIG. 1A shows a conventional wire-bonded semiconductor device, and FIG. 1B shows a flip-chip bonded semiconductor device. The horizontal type light-emitting diode device uses non-conductive substrate such as a sapphire substrate for an epitaxial process, and has an n-type electrode 105 and p-type electrode 107 both disposed on the same side of the device. Device packaging techniques include a wire-bonding technique and a flip-chip bonding technique. As shown FIG. 1A, a semiconductor optoelectronic chip 123, packaged using the wire-bonding technique, is directly bonded to a packaging substrate 115 and wires 311 are then used to electrically connect the semiconductor optoelectronic chip 123 to the packaging substrate 115. As shown in FIG. 1B, the flip-chip bonding method initially flips the semiconductor optoelectronic chip 123 over and mounts the semiconductor optoelectronic chip 123 on the packaging substrate 115 with bumps 113 for fastening and electrically connecting both. The wire-bonding technique is presently most widely adopted, suitable for rapid and mass production. By contrast, no electrodes and wires are disposed on the active surface of a flip-chip light-emitting diode chip, avoiding the problem of partial light-blocking that occurs with the wire-bonding technique. Therefore, a flip-chip light-emitting diode chip can emit more light compared to a wire-bonded light-emitting diode chip. In addition, a flip-chip light-emitting diode chip is raised higher by bumps, and has better heat dissipation compared to a wire-bonded light-emitting diode directly bonded to a packaging substrate.

The vertical type light-emitting diode device is a recently developed light-emitting diode device, which uses an electrically conductive substrate such as a silicon carbide in replace of a sapphire substrate, or is manufactured using a lift-off technique separating a sapphire substrate from a light-emitting diode. Moreover, the first electrode 215 of a vertical type light-emitting diode device can be either an n-type electrode or a p-type electrode, and the first electrode 215 and the second electrode 217 are disposed opposite to each other, wherein when the first electrode 215 is an n-type electrode, the second electrode 217 is a p-type electrode; when the first electrode 215 is a p-type electrode, the second electrode 217 is an n-type electrode. Referring to FIG. 2, during a packaging process, the first electrode 215 is directly bonded to the packaging substrate 115, and the second electrode 217 is wire bonded to electrically connect to the packaging substrate 115 using wires 311. The vertical type light-emitting diode devices can have better heat dissipation and emit more light compared to the horizontal type light-emitting diode devices. In particular, after the substrate for the epitaxial process is removed using a lift-off process, the electrical conductivity of the light-emitting diode devices is improved. However, the second electrode 217 is formed on the light-emitting region, and when the light-emitting diode device emits light, the second electrode 217 blocks a portion of emitted light, affecting the luminous intensity of the light-emitting diode device. Specially, if the light-emitting region is small, the blocked area on the light-emitting region is comparatively large, and the luminous intensity is more significantly affected. In theory, if the problem of electrodes blocking emitting light can be avoided, light-emitting diodes packaged using a flip-chip technique can have improved heat dissipation and higher luminous intensity. However, such a problem is difficult to avoid because the manufacturing processes of light-emitting diode devices cannot be easily changed. FIGS. 3A to 3C show a method of forming a flip chip light-emitting diode device. As shown in FIG. 3A, after a light-emitting structure 309 is formed on an epitaxial substrate 101, multiple first electrodes 215 are formed on the light-emitting structure 309. Next, the light-emitting structure 309 is then etched to show the n-type conductive layer. As shown in FIG. 3B, multiple second electrodes 217 are formed on the n-type conductive layer using a sputtering process. Multiple bumps 113 are separately disposed on the second electrodes 217 and the first electrodes 215 for electrical connection. Next, the epitaxial substrate 101 is removed. As shown in FIG. 3C, the individual light-emitting diodes are diced out. In fact, in the above-mentioned processes, several issues need to be resolved.

The first issue is in the etching process. The thickness ratio between the light-emitting structure 309 and the first electrode 215 may achieve a value of 1:20, and the light-emitting structure 309 can be exposed when the first electrode 215 thereon is completely removed. Therefore, the thickness of the first electrode 215 is a major factor that needs to be considered. However, the etching depth needed to expose the light-emitting structure is usually difficult to estimate. The second issue is related to the formation of the second electrode. Usually, the second electrode is formed using a sputtering process. As shown in FIG. 3A, the second electrodes 217 are formed within deep U-shaped spaces. Using a sputtering process to form second electrodes 217 within such deep U-shaped spaces 313 is difficult. In addition, the second electrode 127 is required to have a height equivalent to that of the first electrode 215, and each second electrode 127 must be suitably distant from the first electrode 215 and the light-emitting structure 209 such that short circuiting can be prevented and a sufficient space can be reserved for the dicing process. Forming an electrode within a deep U-shaped space 313 while following the aforementioned requirements make the manufacturing processes more difficult. The third issue is related to the thermal stresses between the first electrode 215 and the light-emitting structure 309. The electrode is mainly made of metal, and the light-emitting structure is made of Group III-V semiconductor compound. Generally, the thermal expansion coefficient of metal is higher than that of GaN material. Referring to FIG. 3B, when using a laser lift-off technique to remove the epitaxial substrate 101, the temperature may reach about 400 degrees C., and therefore, thermal stresses between the first electrodes 215 and the light-emitting structure 309 may develop, resulting in the deformation of the first electrodes 215 and damage to the light-emitting structure 309.

Thus, the present invention provides a flip chip semiconductor optoelectronic device without the above-mentioned issues.

SUMMARY OF THE INVENTION

According to the discussion in the Description of the Related Art and to meet the requirements of industry, the present invention provides a semiconductor optoelectronic device and a method for fabricating the same. The method comprises the steps of: forming a sacrificial layer on an epitaxial substrate; forming a semiconductor light-emitting structure on the sacrificial layer; etching the semiconductor light-emitting structure; flip chip bonding the semiconductor light-emitting structure to a packaging substrate; and etching the sacrificial layer to separate the epitaxial substrate.

One objective of the present invention is to apply the technique of separation of an epitaxial substrate to the flip chip bonding technique.

Another objective of the present invention is to increase the luminous intensity of a semiconductor optoelectronic device.

Another objective of the present invention is to improve the heat dissipation of a semiconductor optoelectronic device.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which:

FIG. 5A to 5Q are cross sections showing the steps of the method for fabricating a semiconductor optoelectronic device according to one embodiment of the present invention, wherein FIGS. 5A to 5E are cross sections showing the steps of the method for forming a sacrificial layer according to one embodiment of the present invention;

DETAILED DESCRIPTION OF THE INVENTION

Figure 1A:
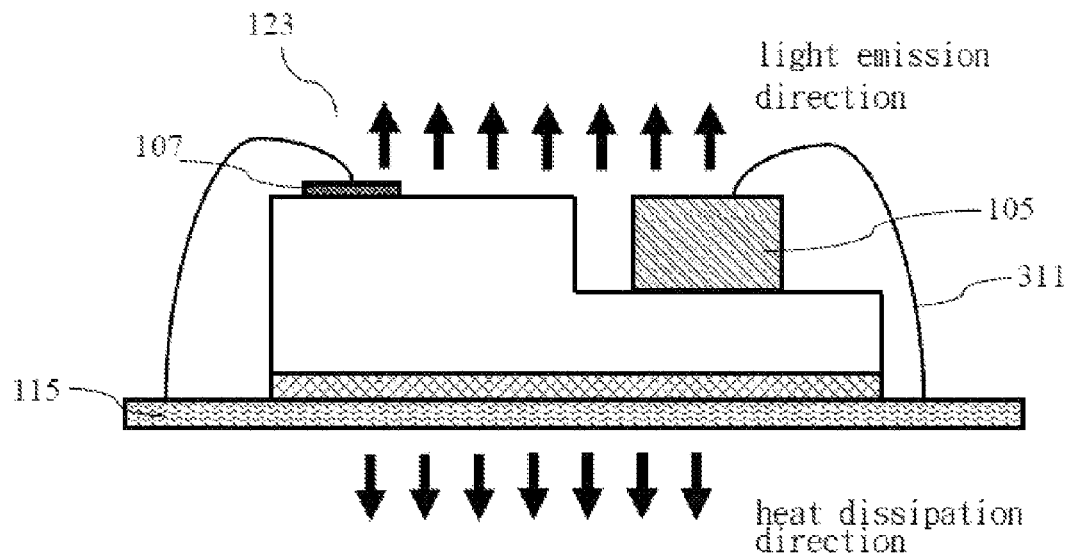
FIG. 1A shows a conventional wire-bonded light emitting diode chip.
Figure 1B:
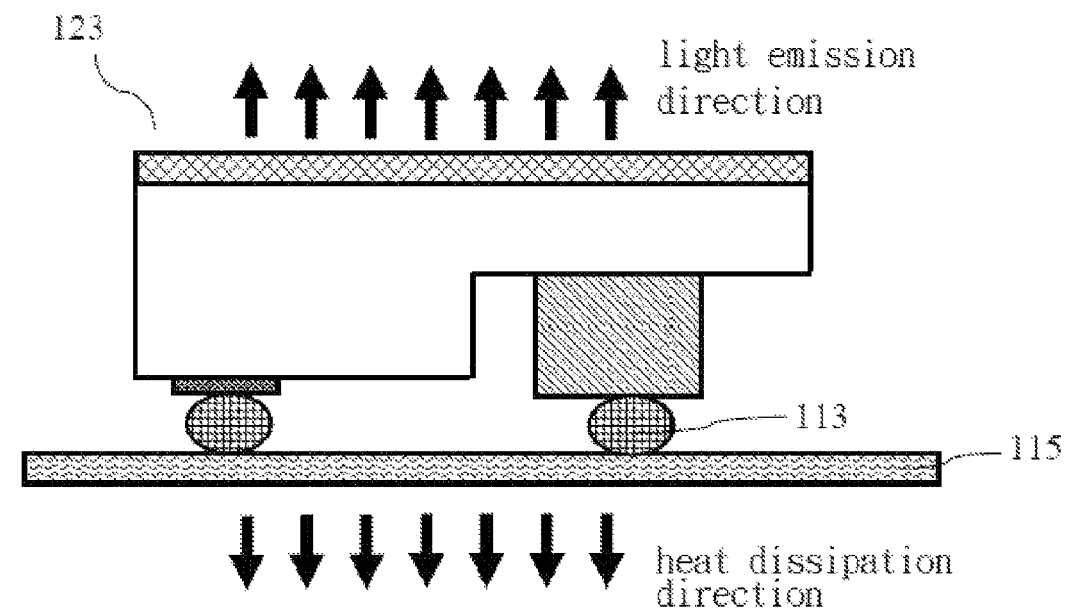
FIG. 1B shows a conventional flip-chip light-emitting diode chip.
Figure 2:
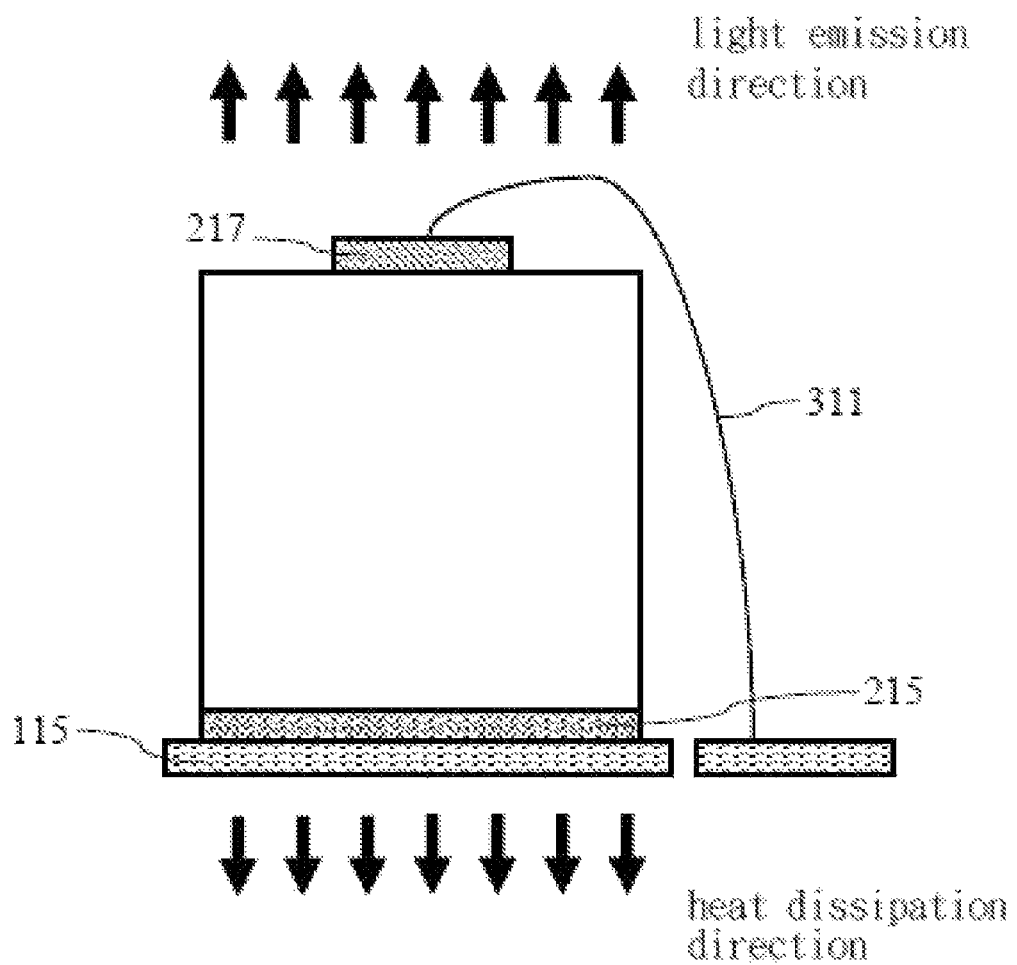
FIG. 2 shows a conventional vertical type light-emitting diode device.
Figure 3A:
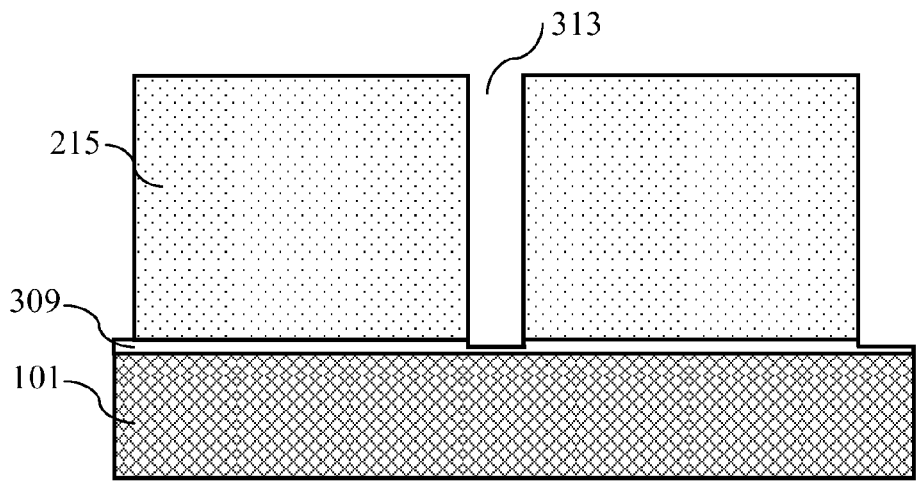
FIGS. 3A to 3C are cross sections showing steps of etching and separating an epitaxial substrate from a flip-chip semiconductor optoelectronic device according to one embodiment of the present invention.
Figure 3B:
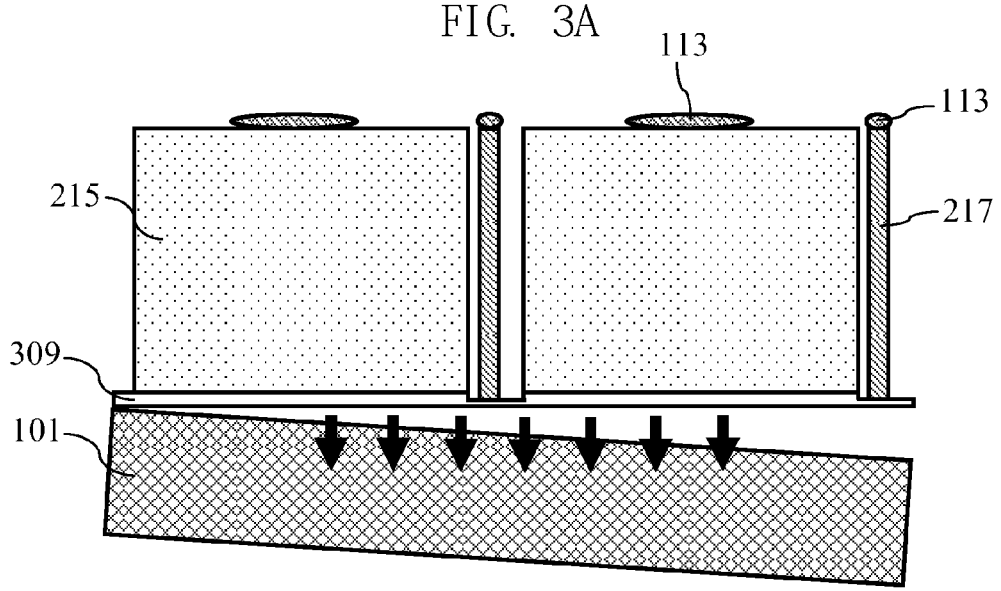
Figure 3C:
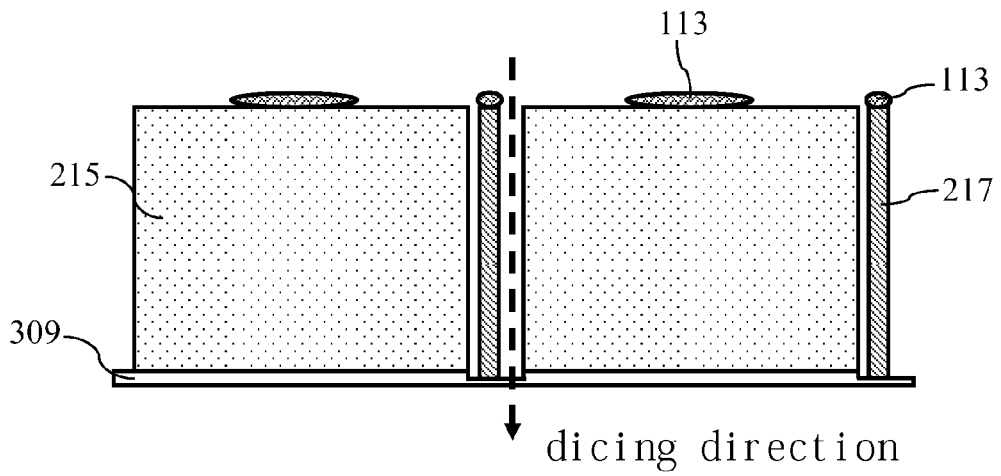

The present invention exemplarily demonstrates embodiments of a semiconductor optoelectronic device and a method for fabricating the same. In order to thoroughly understand the present invention, detailed descriptions of method steps and components are provided below. Clearly, the implementations of the present invention are not limited to the specific details that are familiar to persons skilled in the art related to optoelectronic semiconductor manufacturing processes to avoid unnecessary limitations to the present invention. On the other hand, components or method steps that are well known are not described in detail. A preferred embodiment of the present invention is described in detail as follows. However, in addition to the preferred detailed description, other embodiments can be broadly employed, and the scope of the present invention is not limited by any of the embodiments, but should be defined in accordance with the following claims and their equivalents.

The present invention provides a flip chip semiconductor optoelectronic device comprising a packaging substrate that includes a first surface, a second surface opposite to the first surface of the packaging substrate, a first bond pad formed on the first surface of the packaging substrate, a second bond pad formed on the first surface of the packaging substrate, a first bump formed on the first bond pad, and a second bump formed on the second bond pad; a semiconductor light-emitting structure including a first surface and a second surface opposite to the first surface of the semiconductor light-emitting structure, an n-type electrode formed on the first surface of the semiconductor light-emitting structure, a p-type electrode formed on the first surface of the semiconductor light-emitting structure, wherein the n-type electrode is electrically attached to the first bump, and the p-type electrode is electrically attached to the second bump; a dielectric layer disposed between the n-type electrode and the p-type electrode to electrically insulate the n-type electrode from the p-type electrode; and a transparent adhesive material disposed between the first surface of the packaging substrate and the first surface of the semiconductor light-emitting structure, enclosing the first bond pad, the second bond pad, the first bump, and the second bump.

The packaging substrate can be a printed circuit board, a bismaleimide triazine resin printed circuit board, a metal core printed circuit board, a flexible printed circuit board, a ceramic substrate, or a silicon substrate.

The first and second bumps comprise palladium tin alloy.

The n-type electrode comprises titanium/aluminum/titanium/gold alloy.

The p-type electrode includes nickel gold alloy, chromium gold alloy, platinum gold alloy, tungsten, or palladium.

The dielectric layer includes silicon oxide, epoxy resin, silicon nitride, titanium oxide, or aluminum nitride.

The transparent adhesive material includes epoxy resin, silicone or silicon nitride.

The flip chip semiconductor optoelectronic device may further comprise a protecting layer, which can include silicon oxide.

Further, the present invention provides a method for fabricating a flip-chip semiconductor optoelectronic device. The method comprises the steps of: providing an epitaxial substrate; forming a sacrificial layer on the epitaxial substrate; forming a semiconductor light-emitting structure on the sacrificial layer, the semiconductor light-emitting structure including a first surface and a second surface opposite to the first surface, wherein the sacrificial layer is on the second surface of the semiconductor light-emitting structure; forming an n-type electrode and a p-type electrode on the first surface of the semiconductor light-emitting structure; flip chip bonding the semiconductor light-emitting structure to a packaging substrate including a first surface, a second surface opposite to the first surface of the packaging substrate, a first bond pad formed on the first surface of the packaging substrate, a second bond pad formed on the first surface of the packaging substrate, a first bump formed on the first bond pad, and a second bump formed on the second bond pad, wherein the n-type electrode is electrically attached to the first bump, and the p-type electrode is electrically attached to the second bump; disposing a transparent adhesive material between the first surface of the packaging substrate and the first surface of the semiconductor light-emitting structure, enclosing the first bond pad, the second bond pad, the first bump, and the second bump; and separating the epitaxial substrate by etching the sacrificial layer.

In one embodiment, the above-mentioned method further comprises the steps of: forming a first Group III nitride semiconductor layer on the epitaxial substrate; forming a patterned mask on the first Group III nitride semiconductor layer; etching the first Group III nitride semiconductor layer; and removing the patterned mask.

In another embodiment, the method further comprises the steps of: forming a first Group III nitride semiconductor layer on the epitaxial substrate; forming a patterned mask on the first Group III nitride semiconductor layer; forming a second Group III nitride semiconductor layer on the patterned mask; and removing the patterned mask to form a plurality of openings.

In the third embodiment, the method further comprises the steps of: forming a mask on the epitaxial substrate; annealing the mask to obtain a patterned mask; etching the epitaxial substrate; and removing the patterned mask.

The sacrificial layer can be etched by a wet etch or dry etch, or the sacrificial layer is etched by employing an inductively coupled plasma etcher.

The method further comprises a step of: forming a dielectric layer between the n-type electrode and the p-type electrode to increase the hardness of the semiconductor light-emitting structure and to electrically insulate the n-type electrode from the p-type electrode.

The method further comprises a step of forming a protecting layer around the semiconductor light-emitting structure, and the step of forming a protecting layer is performed before said step of separating said epitaxial substrate.

The epitaxial substrate can be a sapphire substrate, a silicon carbide substrate, a lithium aluminate substrate, a lithium gallate substrate, a silicon substrate, a gallium nitride substrate, a zinc oxide substrate, an aluminum zinc oxide substrate, a gallium arsenide substrate, a gallium phosphide substrate, a gallium antimonide substrate, an indium phosphide substrate, an indium arsenide substrate, or a zinc selenide substrate.

Figure 4:
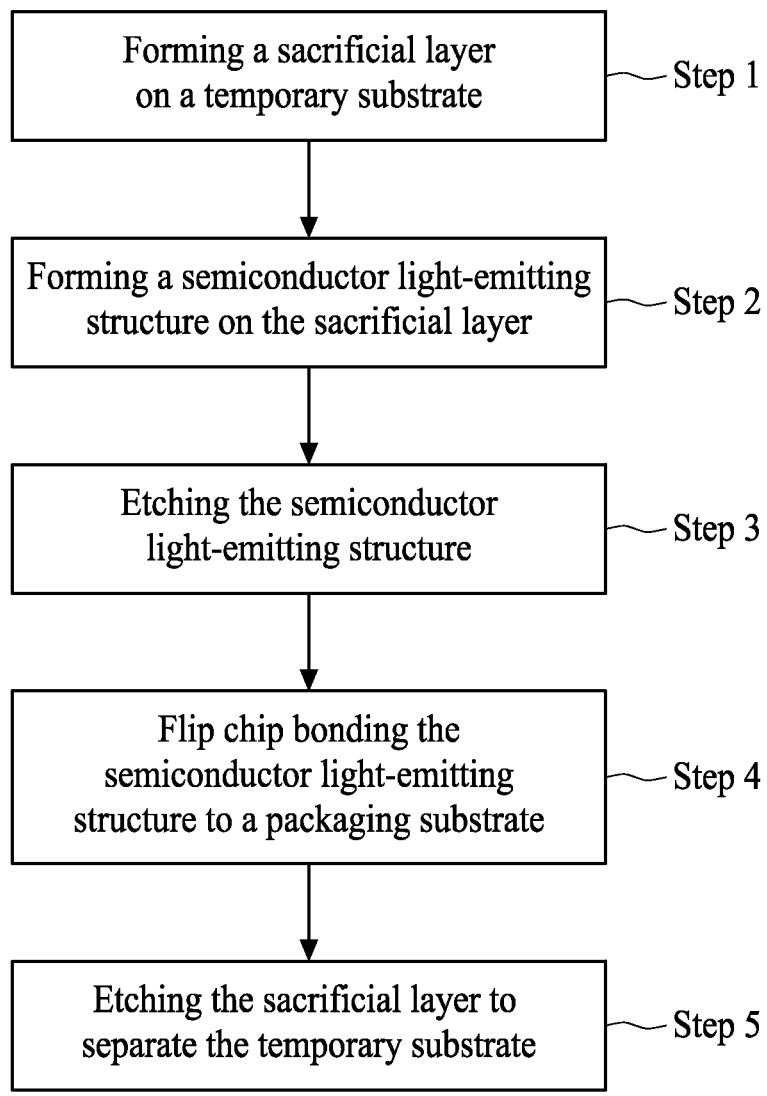
FIG. 4 is a flow chart showing a method for fabricating a flip-chip semiconductor optoelectronic device according to one embodiment of the present invention.

FIG. 4 is a flow chart showing a method for fabricating a flip-chip semiconductor optoelectronic device according to one embodiment of the present invention. In Step 1, a sacrificial layer is initially formed, and the sacrificial layer can be formed using any of three formation methods. The first formation method disposes a first Group III nitride semiconductor layer on the epitaxial substrate. Next, a patterned mask is formed on the first Group III nitride semiconductor layer. Thereafter, the first Group III nitride is etched. Finally, the patterned mask is removed. The second formation method initially disposes a first Group III nitride semiconductor layer on the epitaxial substrate. Next, a patterned mask is formed on the first Group III nitride semiconductor layer. Thereafter, a second Group III nitride semiconductor layer is disposed on the patterned mask. Finally, the patterned mask is removed to obtain a plurality of openings. The third formation method initially forms a mask on the epitaxial substrate. Next, the mask is annealed to obtain a patterned mask. Thereafter, the epitaxial substrate is etched. Finally, the patterned mask is removed. Using a sacrificial layer is an easy method to remove the epitaxial substrate in final processes without using a laser.

In Step 2, a semiconductor light-emitting structure is formed on the sacrificial layer. The semiconductor light-emitting structure can be deposited on the sacrificial layer using the metal organic chemical vapor deposition (MOCVD) technique or the molecular beam epitaxy (MBE) technique. The semiconductor light-emitting structure may comprise an n-type conductive layer, a luminescent layer, an electron stopper layer, and a p-type conductive layer. Further, an ohmic contact layer is formed on the p-type conductive layer such that the current-voltage curve can be linear, increasing the stability of the semiconductor optoelectronic device.

In Step 3, the semiconductor light-emitting structure is etched to form a light emitting region, a dicing surface, and to expose the n-type conductive layer. A plurality of n-type electrodes are separately formed on the n-type conductive layer, and a plurality of p-type electrodes are formed on the ohmic contact layer for electrical connection. Moreover, a dielectric layer is formed between the n-type electrodes and the p-type electrodes such that the semiconductor light-emitting structure can gain sufficient support, and the luminous intensity of the semiconductor light-emitting structure can be increased, and the interference between the n-type electrodes and the p-type electrodes can be reduced.

In Step 4, the semiconductor light-emitting structure is flip chip bonded to a packaging substrate. On each of the n-type and p-type electrodes, a bump is formed. Using a flip chip technique, each bump is electrically attached to a pad on the packaging substrate. The application of the flip chip technique to bond the semiconductor light-emitting structure can prevent the problem of the electrodes blocking the light-emitting region so as to increase light extraction efficiency.

In Step 5, the sacrificial layer is etched to separate the epitaxial substrate. Before the etching process is performed, the light-emitting structure needs protection against etchant to avoid damage. Therefore, a transparent adhesive material is filled between the semiconductor light-emitting structure and the packaging substrate, enclosing the bumps and the pads for maintaining electrical connections. In addition, a protecting layer is formed to enclose the semiconductor light-emitting structure and the packaging substrate so that they can be protected from the etchant. Next, an etchant with a suitable etch selectivity is introduced into the openings of the sacrificial layer to etch the sacrificial layer such that the epitaxial layer can be separated. Finally, the protecting layer is removed.

The method of the present invention will be explained by showing the cross section of the structure in each process step with the descriptions of the details of the step.

Figure 5A:
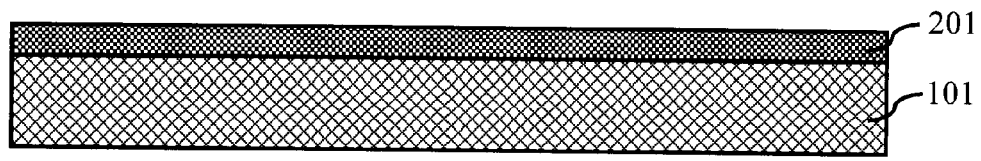
Figure 5B:
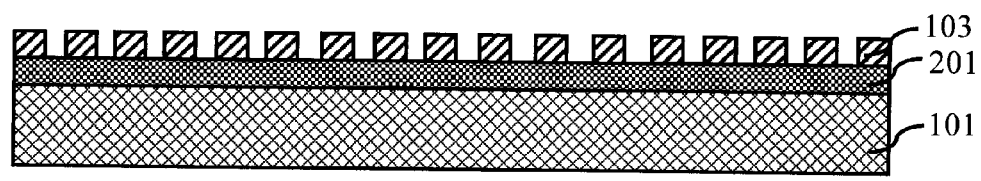
Figure 5C:
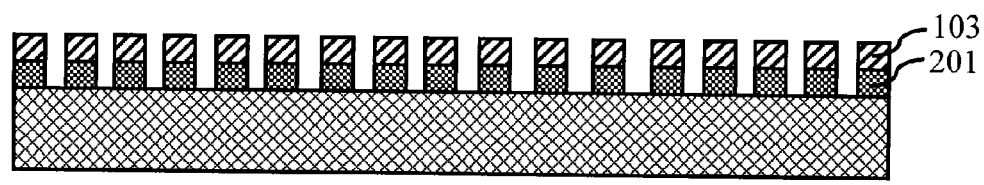
Figure 5D:
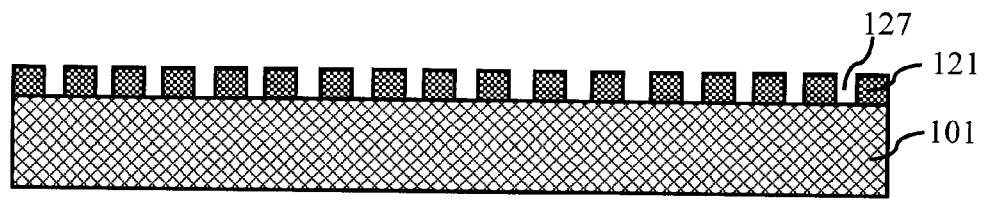
Figure 5E:
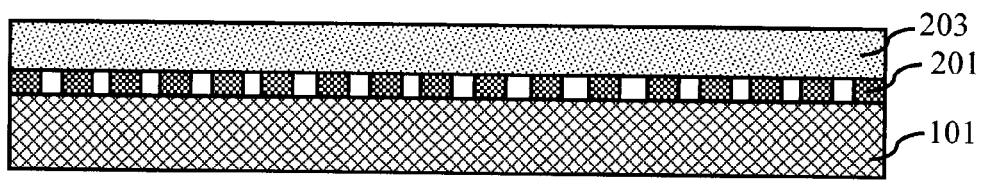

A sacrificial layer is initially formed on an epitaxial substrate. The present invention provides three formation methods for forming the sacrificial layer. The steps in the first formation method are demonstrated in FIGS. 5A to 5E. As shown in FIG. 5A, a first Group III nitride semiconductor layer 201 is disposed on the epitaxial substrate 101. As shown in FIG. 5B, a patterned mask 103 is formed on the first Group III nitride semiconductor layer 201. As shown in FIG. 5C, the first Group III nitride semiconductor layer 201 is then etched. As shown in FIG. 5D, the patterned mask 103 is removed from the first Group III nitride semiconductor layer 201 to obtain a sacrificial layer, which may comprise a plurality of grooves 127 and a plurality of pillar elements 121. As shown in FIG. 5E, a second Group III nitride semiconductor layer 203 is disposed on the sacrificial layer as a buffer layer. The detailed descriptions and processing steps related to the first formation method for forming the sacrificial layer can be found by referring to Taiwan Patent Application No. 097107609, entitled "METHOD OF FABRICATING PHOTOELECTRIC DEVICE OF III-NITRIDE BASED SEMICONDUCTOR AND STRUCTURE THEREOF," assigned to Advanced Optoelectronic Technology, Inc.

Figure 6A:
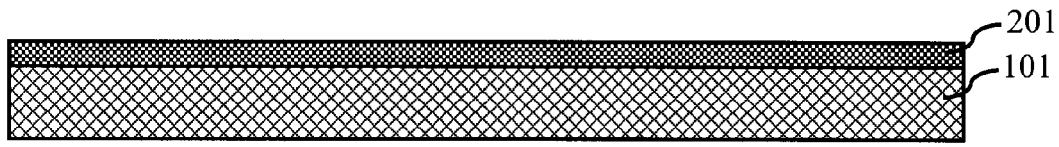
FIG. 6A to 6E are cross sections showing the steps of the method for forming a sacrificial layer according to another embodiment of the present invention.
Figure 6B:
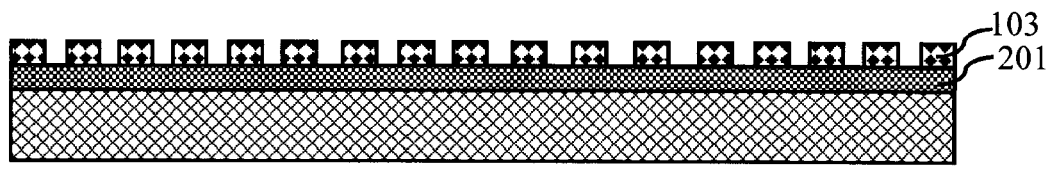
Figure 6C:
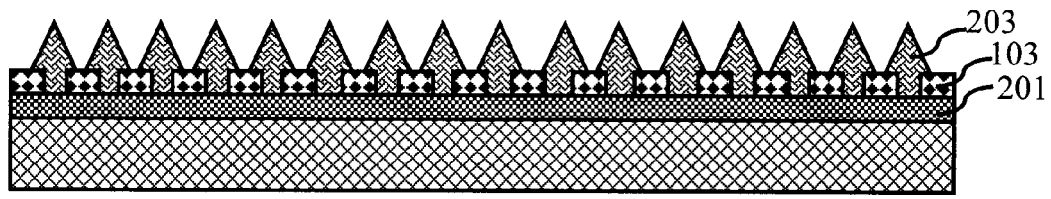
Figure 6D:
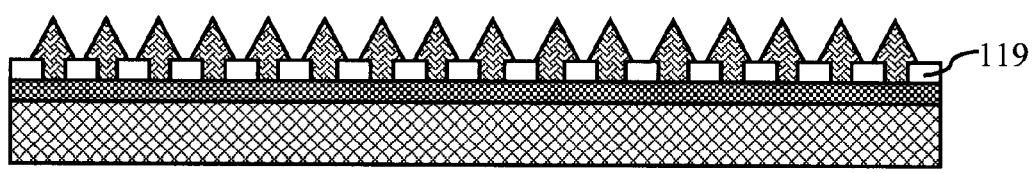
Figure 6E:
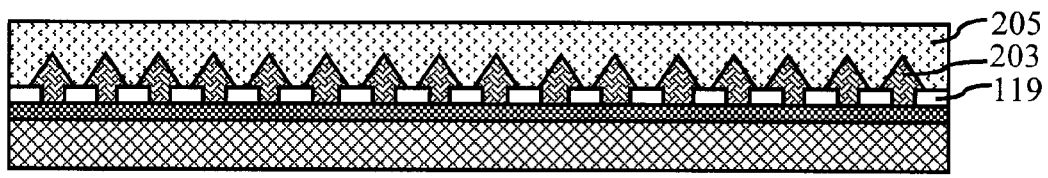

Further, the steps of another method for forming the sacrificial layer are shown in FIGS. 6A to 6E. As shown in FIG. 6A, a first Group III nitride semiconductor layer 201 is disposed on the epitaxial substrate 101. As shown in FIG. 6B, a patterned mask 103 is then formed on the first Group III nitride semiconductor layer 201. As shown in FIG. 6C, a second Group III nitride semiconductor layer 203 is thereafter formed on the patterned mask 103. As shown in FIG. 6D, the patterned mask 103 is removed to obtain a second Group III nitride semiconductor layer 203 having a plurality of openings 119, accordingly turned into a sacrificial layer. Finally, a third Group III nitride semiconductor layer 205 is disposed on the sacrificial layer as a buffer layer as shown in FIG. 6E. The detailed descriptions and processing steps related to the second formation method for forming the sacrificial layer can be found by referring to Taiwan Patent Application No. 097115512, entitled "METHOD OF FABRICATING PHOTOELECTRIC DEVICE OF III-NITRIDE BASED SEMICONDUCTOR AND STRUCTURE THEREOF," assigned to Advanced Optoelectronic Technology, Inc.

Figure 7A:
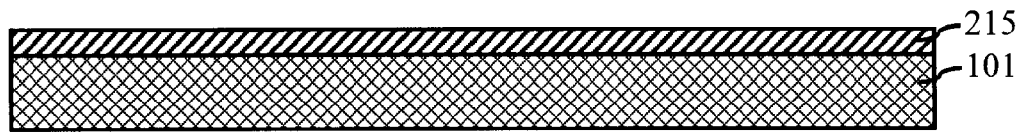
FIG. 7A to 7E are cross sections showing the steps of the method for forming a sacrificial layer according to the third embodiment of the present invention.
Figure 7B:
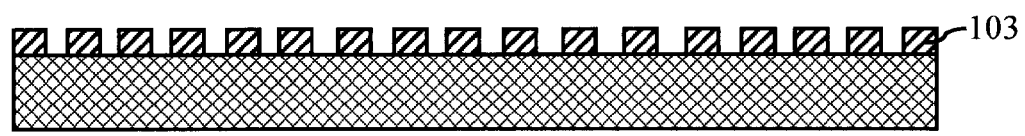
Figure 7C:
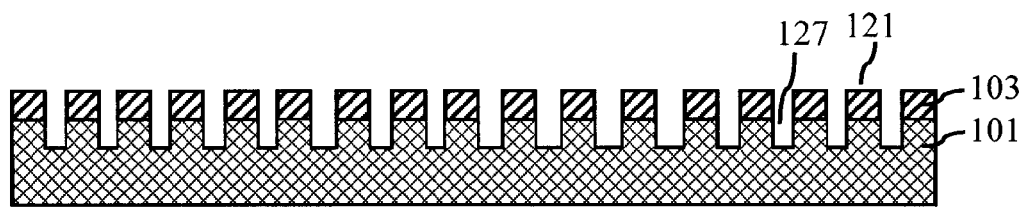
Figure 7D:
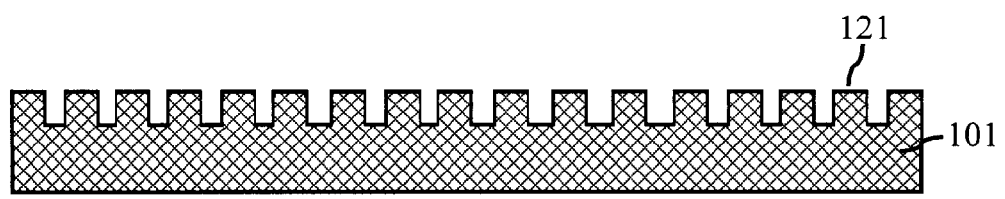
Figure 7E:
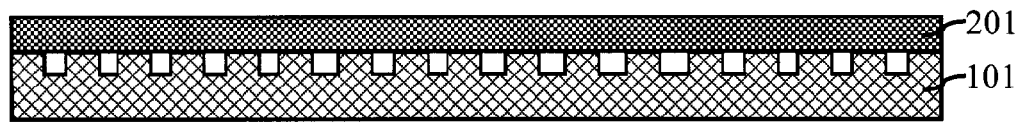

The steps of another method for forming the sacrificial layer are shown in FIGS. 7A to 7E. As shown in FIG. 7A, a first electrode 215 is formed on the epitaxial substrate 101. As shown in FIG. 7B, the first electrode 215 is annealed to form a patterned mask 103. As shown in FIG. 7C, the epitaxial substrate 101 is then etched to form a sacrificial layer, which comprises a plurality of grooves 127 and a plurality of pillar elements 121. As shown in FIG. 7D, the patterned mask 103 is removed. As shown in FIG. 7E, a Group III nitride semiconductor layer 201 is finally formed on the sacrificial layer as a buffer layer. The detailed descriptions and processing steps related to the third formation method for forming the sacrificial layer can be found by referring to Taiwan Patent Application No. 097117099, entitled "METHOD FOR SEPARATING SEMICONDUCTOR AND SUBSTRATE," assigned to Advanced Optoelectronic Technology, Inc.

The following steps will be explained by taking the first sacrificial layer formation method as an example.

Figure 5F:
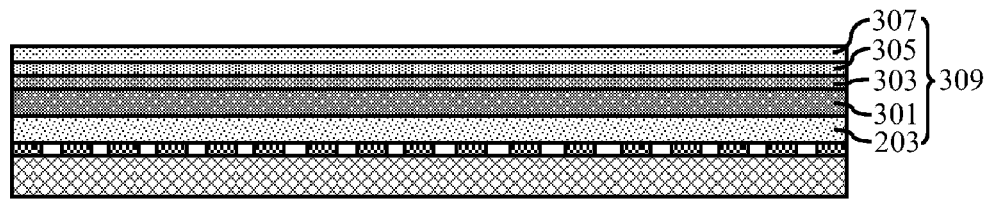

As shown in FIG. 5F, Group IV atoms are implanted to form an n-type conductive layer 301 located on the second Group III nitride semiconductor layer 203. In the present embodiment, the Group IV atom can be a silicon atom. The silicon precursor in the metal organic chemical vapor deposition equipment can be silane ($SiH_4$) or disilane ($Si_2H_6$). The n-type conductive layer 301 is manufactured by forming a gallium nitride layer doped with high concentrated silicon or an aluminum gallium nitride doped with high concentrated silicon, and then forming a gallium nitride layer doped with low concentrated silicon or an aluminum gallium nitride layer doped with low concentrated silicon. The gallium nitride layer doped with high concentrated silicon or the aluminum gallium nitride doped with high concentrated silicon can provide the n-type electrodes with better electrical conductivity.

Thereafter, a luminescent layer 303 is formed on the n-type conductive layer 301, wherein the luminescent layer 303 can be a single hetero-structure, a double hetero-structure, a single quantum well layer, or a multiple quantum well layer. In the present invention, a multiple quantum well layer structure, namely a multiple quantum well layer/barrier layer structure, is adopted. The quantum well layer can be made of indium gallium nitride, and the barrier layer can be made of a ternary alloy such as aluminum gallium nitride. Further, a quaternary alloy such as $Al_xIn_yGa_{1-x-y}N$ can be used for formation of the quantum well layer and the barrier layer, wherein the barrier layer with a wide band gap and the quantum well layer with a narrow band gap can be obtained by adjusting the concentrations of aluminum and indium in the aluminum indium gallium nitride. The luminescent layer 303 can be doped with an n-type or p-type dopant, or can be doped with an n-type and p-type dopants simultaneously, or can include no dopants. In addition, the quantum well layer can be doped and the barrier layer can be not doped; the quantum well layer can be not doped and the barrier layer can be doped; both the quantum well layer and the barrier layer can be doped; or neither the quantum well layer nor the barrier layer can be doped. Further, a portion of the quantum well layer can be delta-doped.

Thereafter, an electron stopper layer 305 of p-type conduction is formed on the luminescent layer 303. The electron stopper layer 305 of p-type conduction may comprise a first Group III-V compound semiconductor layer and a second Group III-V compound semiconductor layer. The first and second Group III-V compound semiconductor layers can have two different band gaps, and are periodically and repeatedly deposited on the luminescent layer 303. The periodical and repeated deposition process can form an electron stopper layer having a wider band gap, which is higher than that of the active luminescent layer so as to block excessive electrons overflowing from the luminescent layer 303. The first Group III-V compound semiconductor layer can be an aluminum indium gallium nitride ($Al_xIn_yGa_{1-x-y}N$) layer. The second Group III-V compound semiconductor layer can be an aluminum indium gallium nitride ($Al_uIn_vGa_{1-u-v}N$) layer, wherein $0<x\leq1$, $0\leq y<1$, $x+y\leq1$, $0\leq u<1$, $0\leq v\leq1$, and $u+v\leq1$. When x is equal to u, y is not equal to v. Further, the first and second Group III-V compound semiconductor layers can be of gallium nitride, aluminum nitride, indium nitride, aluminum gallium nitride, indium gallium nitride, or aluminum indium nitride.

Finally, a Group II atom is doped to form a p-type conductive layer 307 on the electron stopper layer 305. In the present embodiment, the Group II atom can be a magnesium atom. The magnesium precursor in the metal organic chemical vapor deposition equipment can be $CP_2Mg$. The p-type conductive layer 307 is manufactured by forming a gallium nitride layer doped with low concentrated magnesium or an aluminum gallium nitride doped with low concentrated magnesium, and then forming a gallium nitride layer doped with high concentrated magnesium, or an aluminum gallium nitride doped with high concentrated magnesium. The gallium nitride layer doped with high concentrated magnesium or the aluminum gallium nitride doped with high concentrated magnesium can provide the p-type electrodes with better conductivity.

Figure 5G:
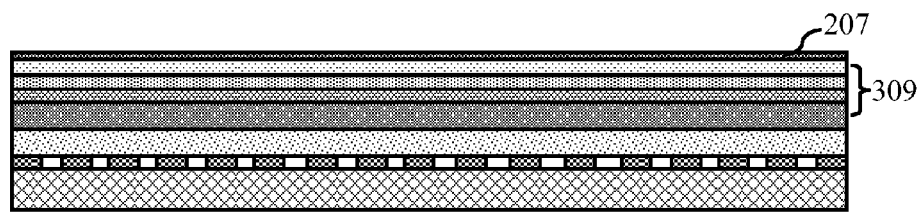

As shown in FIG. 5G, an ohmic contact layer 207 is thereafter formed on the light-emitting structure 309 using physical vapor deposition such as evaporation or sputtering. The material of the ohmic contact layer 207 can be nickel gold alloy, indium tin oxide, indium zinc oxide, indium tungsten oxide, indium gallium oxide, platinum gold alloy, chromium gold alloy, nickel chromium alloy, or nickel/magnesium/nickel/chromium alloy.

Figure 5H:
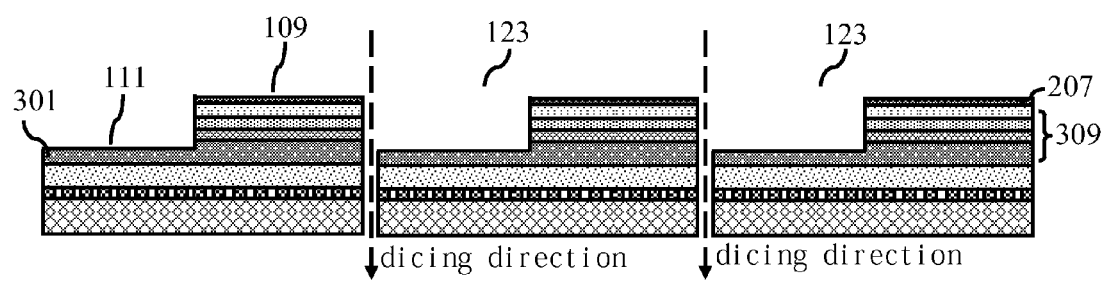

As shown in FIG. 5H, after the formation of the ohmic contact layer 207, a photoresist film is coated on the surface of the ohmic contact layer 207 by centrifugally spinning photoresist on the surface using a photoresist coater. Next, the photoresist film is patterned using a photolithography process to form a mask exposing a portion of the ohmic contact layer 207 prepared for etching. Inductively coupled plasma etcher is used to perform a mesa process, or a wet etch or dry etch is employed to perform a mesa process. The mesa process is applied to obtain a light-emitting region 109 and a dicing surface 111, and simultaneously exposing the n-type conductive layer 301 by etching the light-emitting structure 309. Finally, the wafer is diced into a plurality of semiconductor optoelectronic chips 123 using a laser.

Figure 5I:
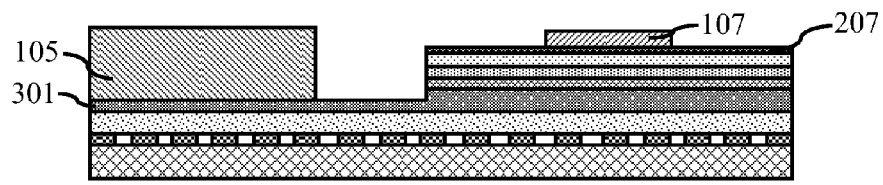

As shown in FIG. 5I, an n-type electrode 105 is formed on the n-type conductive layer 301, and a p-type electrode 107 is formed on the ohmic contact layer 207. The n-type electrode 105 and the p-type electrode 107 can be formed using physical vapor deposition such as evaporation or sputtering. The physical vapor deposition method deposits metal on the n-type conductive layer 301 and the ohmic contact layer 207. The n-type electrode 105 may comprise titanium/aluminum/titanium/gold, chromium gold alloy, or lead gold alloy. The p-type electrode 107 may comprise nickel gold alloy, platinum gold alloy, tungsten, chromium gold alloy, or palladium.

Figure 5J:
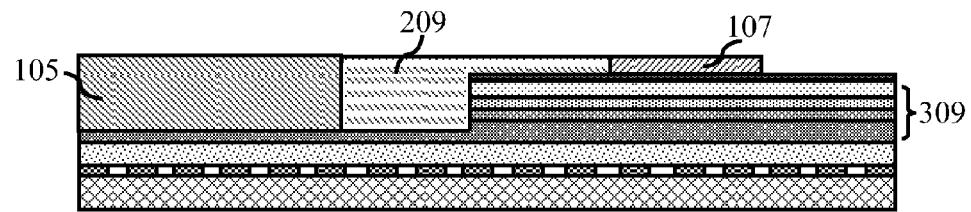

As shown in FIG. 5J, a dielectric layer 209 is located between the n-type electrode 105 and the p-type electrode 107. The dielectric layer 209 can reduce the interference between the n-type electrode 105 and the p-type electrode 107, and can also strengthen the light-emitting structure 309 to avoid fracture. The dielectric layer 209 may comprise silicon oxide, epoxy resin, silicon nitride, titanium oxide, or aluminum nitride.

Figure 5K:
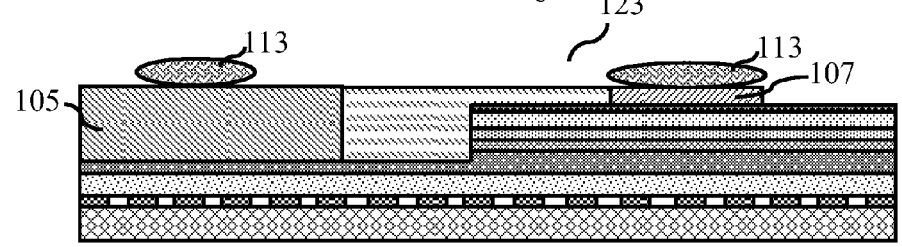
Figure 5L:
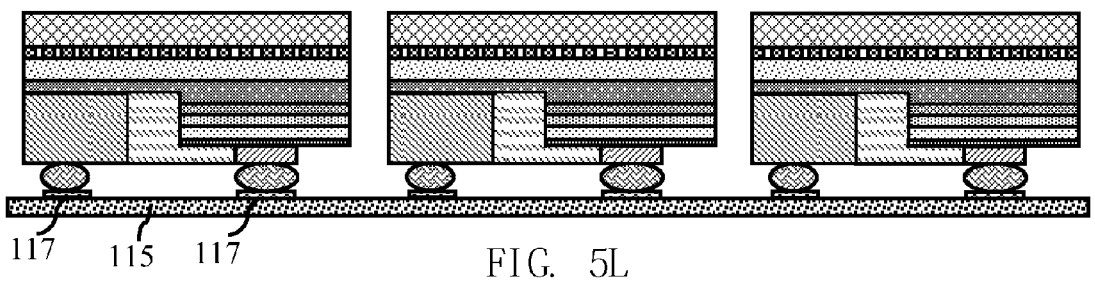

As shown in FIGS. 5K and 5L, one or a plurality of semiconductor optoelectronic chips 123 are bonded to a packaging substrate 115 using a flip-chip technology. A plurality of bumps 113 are respectively formed on the n-type electrode 105 and the p-type electrode 107. The plurality of bumps 113 connect with the corresponding pads 117 on the packaging substrate 115 so as to establish electrical connection. The bumps 113 may comprise lead-tin alloy. The ratio of lead to tin is determined by the type of the packaging substrate and assembly process. Generally, the ratio of lead to tin is 95%: 5%. The packaging substrate 115 can be a printed circuit board, a bismaleimide triazine resin printed circuit board, a metal core printed circuit board, a flexible printed circuit board, a ceramic substrate, or a silicon substrate. The detailed descriptions and the detailed processing steps related to a chip package method using a silicon substrate can be found by referring to Taiwan Patent No. I292962, entitled "PACKAGE STRUCTURE FOR A SOLID-STATE LIGHTING DEVICE AND METHOD OF FABRICATING THE SAME," assigned to Advanced Optoelectronic Technology, Inc.

Figure 5M:
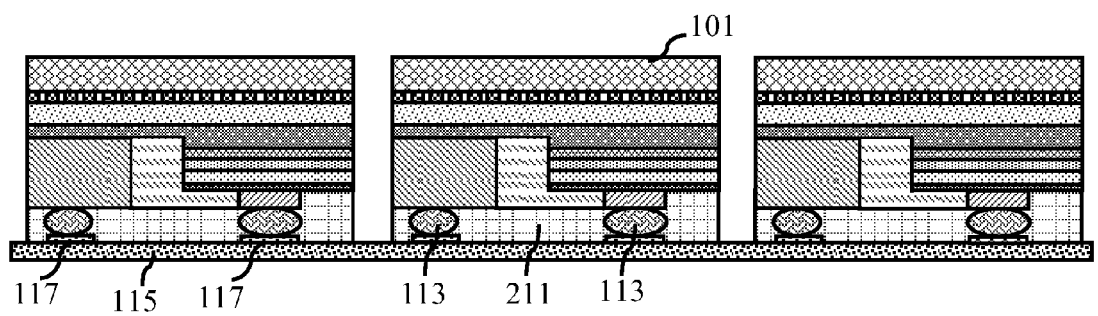
Figure 5N:
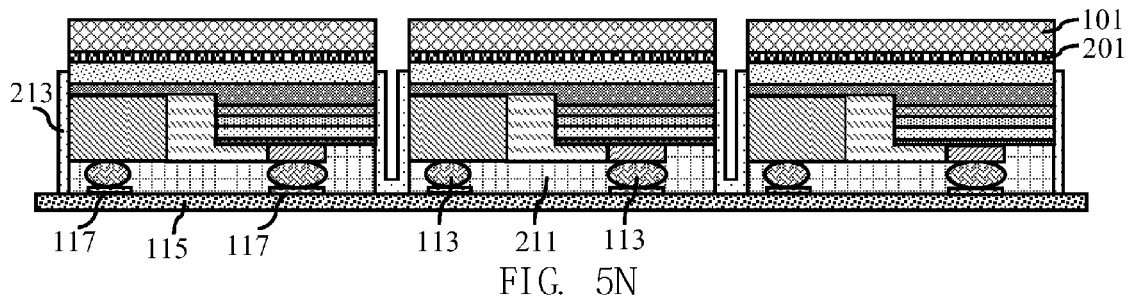

As shown in FIGS. 5M and 5N, before the epitaxial substrate 101 is separated, the electrical connections between the bumps 113 and the packaging substrate 115, and the entire set of semiconductor optoelectronic chips, need protection against etchant to avoid damage. Initially, a transparent adhesive material covers the bumps 113 and the packaging substrate 115, and a protecting layer 213 encloses the entire set of semiconductor optoelectronic chips, while the epitaxial substrate 101 and the first Group-III nitride semiconductor layers 201 are exposed. The transparent adhesive material may include epoxy resin, silicone or silicon nitride. The protecting layer may be silicon oxide.

Figure 5O:
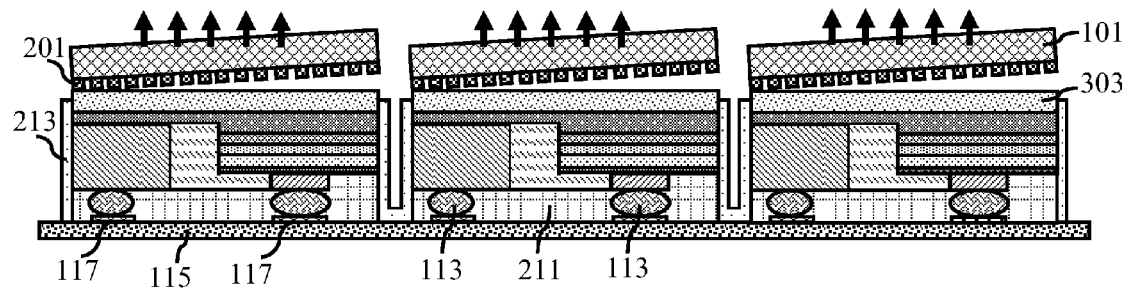

As shown in FIG. 5O, after the protecting layer is formed, a wet etch is applied to separate the epitaxial substrate 101. Suitably selected and formulated chemical solution is introduced into the first Group-III nitride semiconductor layers 201. The chemical solution reacts with the first Group-III nitride semiconductor layers 201, disintegrating the first Group-III nitride semiconductor layers 201. Finally, the epitaxial substrate 101 on the first Group-III nitride semiconductor layers 201 can be released.

Figure 5P:
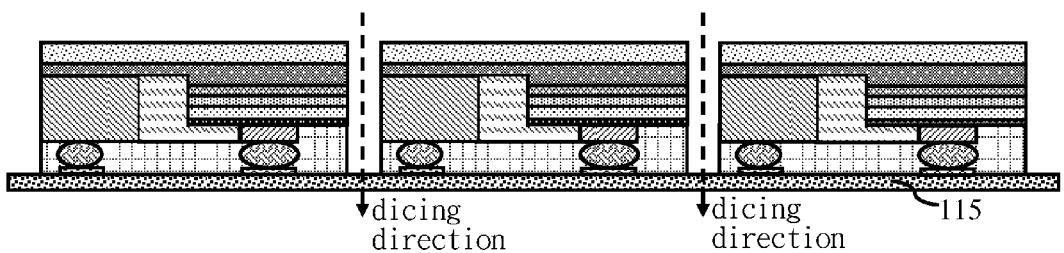
Figure 5Q:
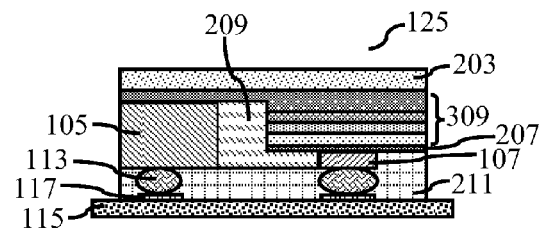

Finally, as shown in FIGS. 5P and 5Q, after the protecting layer 213 on the semiconductor optoelectronic chips 123 is removed, the packaging substrate 115 is diced into a plurality of semiconductor optoelectronic chips 125. The protecting layer 213 can be removed using a wet etch or dry etch. The wet etch may be performed using organic chemical solution such as acetone, n-methoyl-pyrolidinone (NMP), dimethyl sulfoxide (DMSO), 2-aminoethoxy ethanol, monoethanolamine (MEA), and butoxydiglycol (BDG). The wet etch may also be performed using inorganic solution such as the mixture of sulfuric acid and hydrogen peroxide (SPM); such a wet etch method costs less. The dry etch method uses oxygen or plasma to remove the photoresist. After the protecting layer 213 is removed, the packaging substrate 115 is diced into a plurality of semiconductor optoelectronic chip 125 using a cutting blade.

The above-mentioned processes can be arranged in different orders for different processing conditions so as to meet the requirements of the actual process.

Summarily, compared to the light extraction efficiency of conventional semiconductor optoelectronic devices, the semiconductor optoelectronic devices of the present invention are first flip chip bonded, and the epitaxial substrate is removed. The light emitted from the semiconductor optoelectronic device is not blocked by the substrate or electrodes. Therefore, the light extraction efficiency of the semiconductor optoelectronic device of the present invention can be higher. Further, the semiconductor optoelectronic device of the present invention can dissipate heat more efficiently than conventional semiconductor optoelectronic devices. Moreover, the manufacturing process for the semiconductor optoelectronic device of the present invention is simple.

The above-described embodiments of the present invention are intended to be illustrative only. Numerous alternative embodiments may be devised by persons skilled in the art without departing from the scope of the following claims.

What is claimed is:

1. A method for fabricating a flip-chip semiconductor optoelectronic device, comprising the steps of:
   providing an epitaxial substrate;
   forming a sacrificial layer on said epitaxial substrate, which comprises steps of:
      forming a first Group III nitride semiconductor layer on said epitaxial substrate;
      forming a patterned mask on said first Group III nitride semiconductor layer;
      etching said first Group III nitride semiconductor layer; and
      removing said patterned mask;
   forming a semiconductor light-emitting structure on said sacrificial layer, said semiconductor light-emitting structure including a first surface and a second surface opposite to the first surface of said semiconductor light-emitting structure, wherein said sacrificial layer is on said second surface of said semiconductor light-emitting structure;
   forming an n-type electrode and a p-type electrode on said first surface of said semiconductor light-emitting structure;
   flip chip bonding said semiconductor light-emitting structure to a packaging substrate including a first surface, a second surface opposite to said first surface of said packaging substrate, a first bond pad formed on said first surface of said packaging substrate, a second bond pad formed on said first surface of said packaging substrate, a first bump formed on said first bond pad, and a second bump formed on said second bond pad, wherein said n-type electrode is electrically attached to said first bump, and said p-type electrode is electrically attached to said second bump;

disposing a transparent adhesive material between said first surface of said packaging substrate and said first surface of said semiconductor light-emitting structure, enclosing said first bond pad, said second bond pad, said first bump, and said second bump; and separating said epitaxial substrate by etching said sacrificial layer.

2. The method of claim 1, wherein said epitaxial substrate is a sapphire substrate, a silicon carbide substrate, a lithium aluminate substrate, a lithium gallate substrate, a silicon substrate, a gallium nitride substrate, a zinc oxide substrate, an aluminum zinc oxide substrate, a gallium arsenide substrate, a gallium phosphide substrate, a gallium antimonide substrate, an indium phosphide substrate, an indium arsenide substrate, or a zinc selenide substrate.

3. The method of claim 1, wherein said sacrificial layer is etched by a wet etch or dry etch, or said sacrificial layer is etched by employing an inductively coupled plasma etcher.

4. The method of claim 1, wherein the material of said first and second bumps is palladium tin alloy.

5. The method of claim 1, wherein the material of said n-type electrode is titanium/aluminum/titanium/gold alloy, chromium gold alloy or gold lead alloy.

6. The method of claim 1, wherein the material of said p-type electrode is nickel gold alloy, platinum gold alloy, chromium gold alloy, tungsten or palladium.

7. The method of claim 1, further comprising a step of forming a dielectric layer between said n-type electrode and said p-type electrode to increase the hardness of said semiconductor light-emitting structure and to electrically insulate said n-type electrode from said p-type electrode.

8. The method of claim 7, wherein the material of said dielectric layer is silicon oxide, epoxy resin, silicon nitride, titanium oxide, or aluminum nitride.

9. The method of claim 1, further comprising a step of forming a protecting layer around said semiconductor light-emitting structure, and said step of forming a protecting layer is performed before said step of separating said epitaxial substrate.

10. The method of claim 9, wherein the material of said protecting layer is silicon oxide.

11. The method of claim 1, wherein said step of separating said epitaxial substrate by etching said sacrificial layer is performed employing a wet etch method.

12. The method of claim 1, wherein the material of said dielectric layer is silicon oxide, epoxy resin or silicon nitride.

13. The method of claim 1, wherein said packaging substrate is a printed circuit board, a bismaleimide triazine resin printed circuit board, a metal core printed circuit board, a flexible printed circuit board, a ceramic substrate, or a silicon substrate.

14. The method of claim 1, wherein the material of said semiconductor light-emitting structure is Group III-V compound semiconductor.

* * * * *